(12) United States Patent
Kang

(10) Patent No.: US 10,211,415 B2
(45) Date of Patent: Feb. 19, 2019

(54) FOLDABLE DISPLAY DEVICE

(71) Applicant: LG Display Co., Ltd., Seoul (KR)

(72) Inventor: SeungHee Kang, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/820,254

(22) Filed: Nov. 21, 2017

(65) Prior Publication Data

US 2018/0182985 A1 Jun. 28, 2018

(30) Foreign Application Priority Data

Dec. 22, 2016 (KR) ........................ 10-2016-0177099

(51) Int. Cl.
| | | |
|---|---|---|
| *H05K 1/00* | (2006.01) | |
| *H01L 51/00* | (2006.01) | |
| *H01L 51/52* | (2006.01) | |
| *H01L 51/56* | (2006.01) | |
| *G06F 1/16* | (2006.01) | |
| *H01L 27/32* | (2006.01) | |

(52) U.S. Cl.
CPC ............ *H01L 51/0097* (2013.01); *G06F 1/16* (2013.01); *H01L 51/5237* (2013.01); *H01L 51/56* (2013.01); *H01L 27/3276* (2013.01); *H01L 2227/323* (2013.01); *H01L 2251/5338* (2013.01); *H01L 2251/566* (2013.01)

(58) Field of Classification Search
CPC ....... H01L 2251/303; H01L 2251/5338; H01L 27/3244; H01L 27/3267; H01L 27/3276; H01L 51/0097; H01L 51/5237; H01L 51/5246; H01L 51/5253; H01L 51/5293; Y02E 10/549
See application file for complete search history.

(56) References Cited

U.S. PATENT DOCUMENTS

| | | | | |
|---|---|---|---|---|
| 9,886,063 | B2 * | 2/2018 | Yoo ........................ | G06F 1/1652 |
| 2009/0219225 | A1 * | 9/2009 | Cope ........................ | G09F 9/30 |
| | | | | 345/55 |
| 2014/0183473 | A1 * | 7/2014 | Lee ...................... | H01L 51/0097 |
| | | | | 257/40 |
| 2016/0034047 | A1 * | 2/2016 | Lee ........................ | G09G 5/373 |
| | | | | 345/156 |
| 2016/0165726 | A1 | 6/2016 | Lee et al. | |
| 2018/0114950 | A1 * | 4/2018 | Lee ...................... | H01L 51/0097 |
| 2018/0122863 | A1 * | 5/2018 | Bok ...................... | H01L 27/323 |
| 2018/0145124 | A1 * | 5/2018 | Kim ..................... | H01L 27/3276 |

FOREIGN PATENT DOCUMENTS

KR 20160069571 6/2016

* cited by examiner

*Primary Examiner* — Yuriy Semenenko
(74) *Attorney, Agent, or Firm* — Fenwick & West LLP

(57) ABSTRACT

Provided is a foldable display device. The foldable display device includes a flexible substrate which includes a display area, a bezel area enclosing the display area, and a plurality of bending areas extending from one side of the bezel area; and a display unit disposed in the display area, in which the plurality of bending areas is separated from each other. Therefore, even though the foldable display device is folded, the stress concentrated due to the bending and/or folding overlapping in the bending area may be reduced.

11 Claims, 10 Drawing Sheets

FOLDABLE DISPLAY DEVICE

CROSS-REFERENCE TO RELATED APPLICATIONS

This application claims the priority of Republic of Korea Patent Application No. 10-2016-0177099 filed on Dec. 22, 2016, in the Republic of Korea Intellectual Property Office, the disclosure of which is incorporated herein by reference in its entirety.

BACKGROUND

Field of Technology

The present disclosure relates to a foldable display device, and more particularly, to a foldable display device in which when a display area is folded, a less stress is applied to a bending area in which a flexible circuit board is disposed.

Description of the Related Art

Recently, as the society enters an information society, a display field which visually represents an electrical information signal is rapidly being developed. In accordance with the rapid development, various display devices having excellent performance such as thin thickness, light weight, and low power consumption properties have been developed.

Specific examples of the above-mentioned display device may include a liquid crystal display device (LCD), a plasma display panel device (PDP), a field emission display device (FED), an organic light emitting display device (OLED), and the like.

Specifically, the organic light emitting display device is implemented without having a separate light source device, so that it is easy to be implemented as a flexible display device. Further, the liquid crystal display device is also studied to be implemented as a flexible display device. In this case, a flexible material such as plastic or metal foil is used for a substrate of the flexible display device.

Among the flexible display devices, a demand for a foldable display device which may increase a usability of a space for storing a display device or fold a part of the display area so as to watch a displaying area from both sides is being increased.

The foldable display device is designed such that a specific part is repeatedly folded by a user. Therefore, studies for reducing a stress which is applied to a substrate and various components disposed in the substrate when the substrate including a display area is folded are being performed.

Further, as a part of the substrate is already folded to a rear surface of the substrate to implement a narrow bezel, there is a problem in that the stress is concentrated on an area which is folded to the rear surface of the substrate so that various components disposed in the area are cracked.

SUMMARY

An object to be achieved by the present disclosure is to provide a foldable display device in which the stress is not concentrated on a bending area of the flexible substrate which is already bent to implement a narrow bezel even when the flexible substrate is folded along the display area so that durability is improved.

Further, another object to be achieved by the present disclosure is to provide a foldable display device in which as the flexible substrate is folded, signal interference due to the overlapping of a flexible printed circuit board disposed on a rear surface of the flexible substrate is not caused so that signal interference is minimized.

Objects of the present disclosure are not limited to the above-mentioned objects, and other objects, which are not mentioned above, can be clearly understood by those skilled in the art from the following descriptions.

According to an aspect of the present disclosure, there is provided a foldable display device. The foldable display device includes a flexible substrate which includes a display area, a bezel area enclosing the display area, and a plurality of bending areas extending from one side of the bezel area, and a display unit disposed in the display area in which the plurality of bending areas is separated from each other. Therefore, even though the foldable display device is folded, the stress concentrated due to the bending and/or folding overlapping in the bending area may be reduced.

According to another aspect of the present disclosure, there is provided a foldable display device. The foldable display device includes a flexible substrate which includes a display area, a bezel area enclosing the display area, and a plurality of bending areas extending from the bezel area, and a display unit disposed in the display area in which the bending area includes a first bending area extending from one side of the bezel area and a second bending area extending from the other side which is opposite to the one side. Therefore, even though the foldable display device is folded, signal interference caused due to the overlapping of the flexible printed circuit board may be minimized.

Other detailed matters of the exemplary embodiments are included in the detailed description and the drawings.

According to the present disclosure, a folding line and a bending area are disposed so as not to overlap each other, so that even though the flexible substrate is folded along the folding line, the stress is not concentrated on the bending area. Therefore, a foldable display device with improved durability may be provided.

Further, according to the present disclosure, a sum of widths of separated bending areas is equal to a width of the flexible substrate so that a sufficient space for disposing a wiring line in the bending area may be ensured.

Further, according to the present disclosure, the bending area is disposed on both sides of the flexible substrate, so that even when the flexible substrate is folded, the flexible printed circuit board disposed in a pad area extending from the bending area does not overlap. Therefore, the signal interference is minimized.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
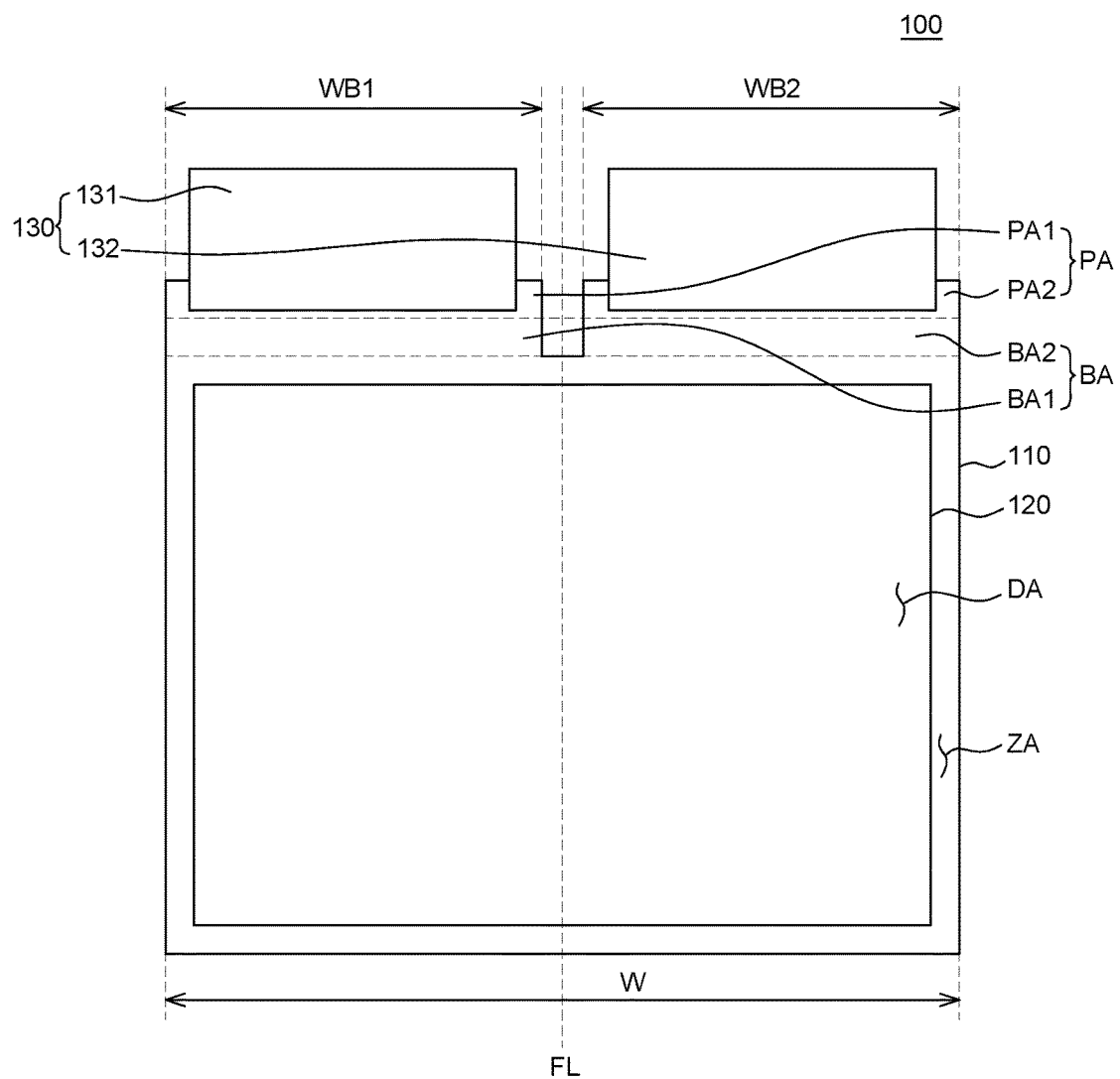
FIG. 1 is a plan view illustrating a foldable display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to exemplary embodiment disclosed herein but will be implemented in various forms. The exemplary embodiments are provided by way of example only so that a person of ordinary skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "comprise" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly" is not used.

When an element or layer is disposed "on" other element or layer, another layer or another element may be interposed directly on the other element or therebetween.

Although the terms "first", "second", and the like are used for describing various components, these components are not confined by these terms. These terms are merely used for distinguishing one component from the other components.

Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways as understood by those skilled in the art, and the embodiments can be carried out independently of or in association with each other.

Hereinafter, various exemplary embodiments of the present disclosure will be described in detail with reference to accompanying drawings.

Figure 2:
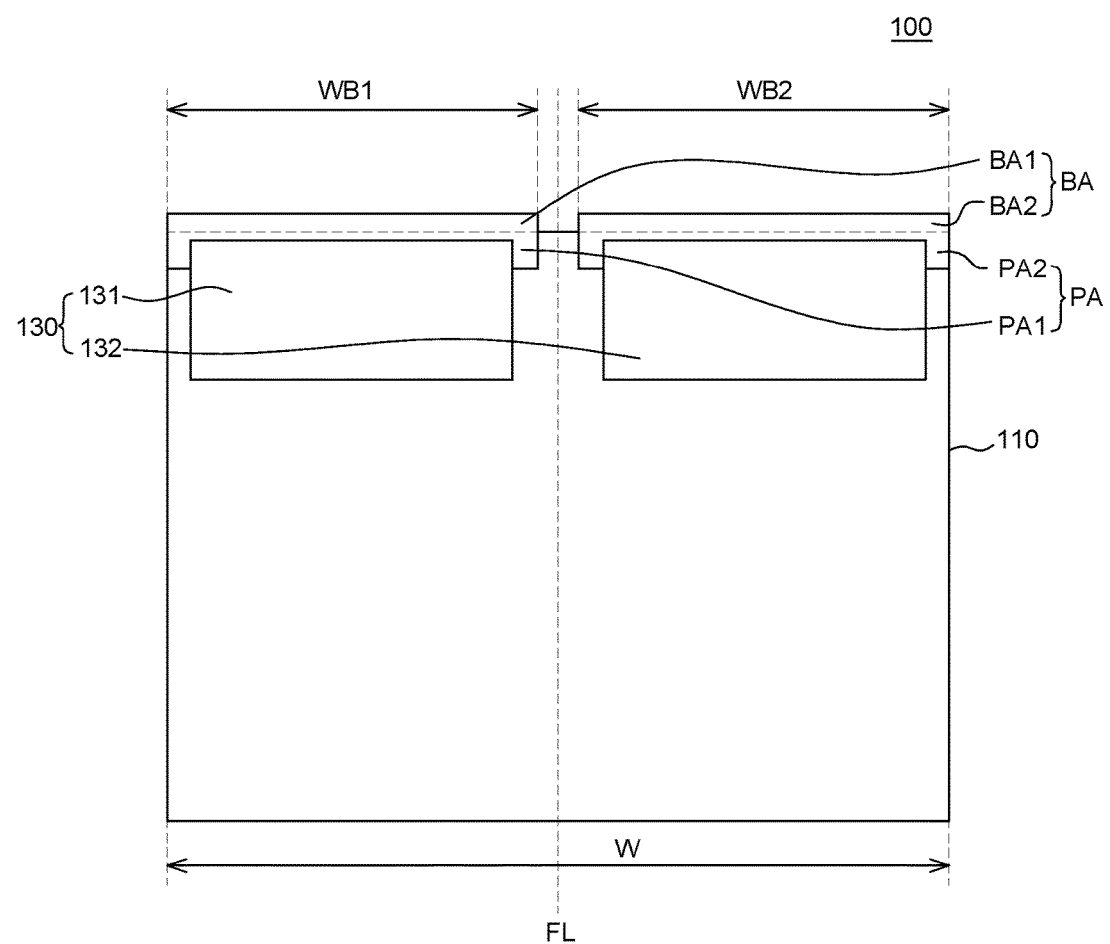
FIG. 2 is a bottom view illustrating a foldable display device in which a bending area of a substrate illustrated in FIG. 1 is bent to a rear surface of the substrate.
Figure 3:
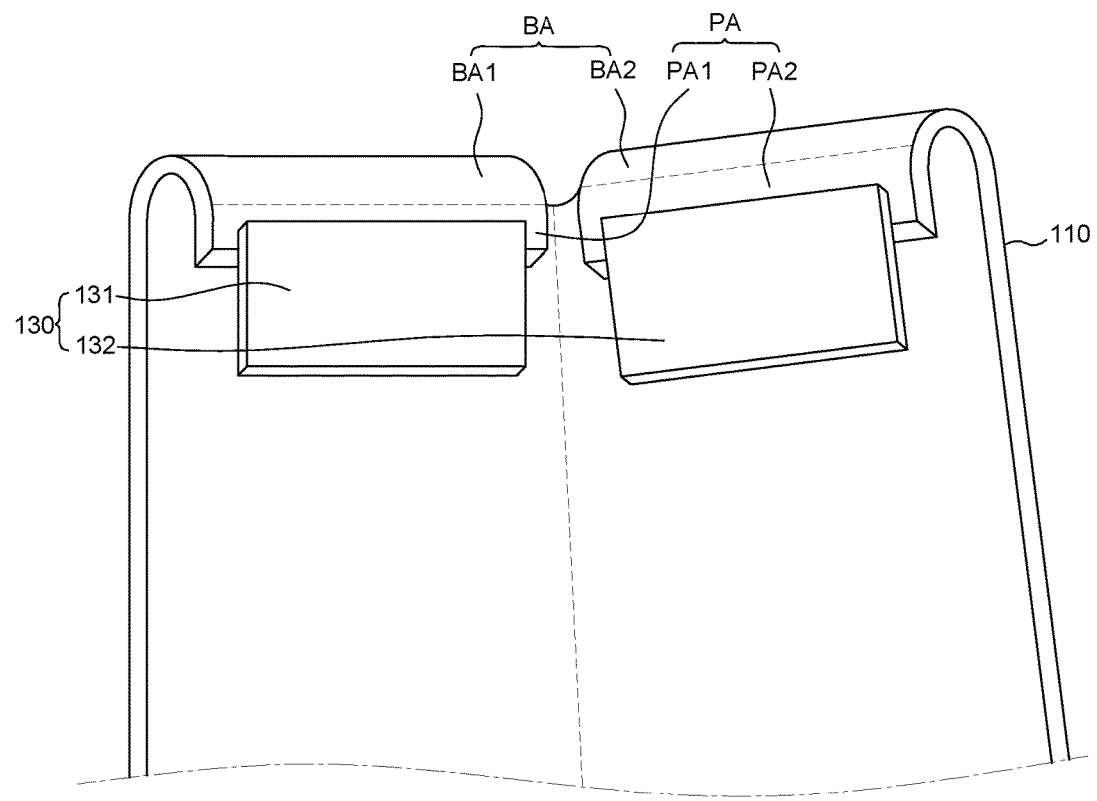
FIG. 3 is a perspective view illustrating a status in which the foldable display device illustrated in FIG. 2 is folded along a folding line.

FIG. 1 is a plan view illustrating a foldable display device according to an exemplary embodiment of the present disclosure. FIG. 2 is a bottom view illustrating a foldable display device in which a bending area of the substrate illustrated in FIG. 1 is bent to a rear surface. FIG. 3 is a perspective view illustrating a status in which the foldable display device illustrated in FIG. 2 is folded along a folding line;

First, referring to FIG. 1, a foldable display device 100 includes a flexible substrate 110 including a display area DA, a bezel area ZA, a bending area BA, and a pad area PA and a display unit 120.

The flexible substrate 110 is a substrate which supports various components of the foldable display device 100. The flexible substrate 110 may be formed of a material having flexibility and specifically, may be formed of a foldable material. For example, the flexible substrate 110 may be formed of a plastic material such as polyimide (PI) or polyethylene terephthalate (PET).

The flexible substrate 110 is configured to be foldable along a folding line FL. The folding line FL is not a physical component which actually exists on the flexible substrate 110, but is a virtual line which is arbitrarily set for the convenience of description. Specifically, as illustrated in FIG. 3, the flexible substrate 110 is folded such that one part and the other part which are divided with respect to the folding line FL overlap each other. Differently from that illustrated in FIGS. 1 to 3, two or more folding lines FL may be provided, which will be described below with reference to FIG. 4.

The folding line FL is disposed across the display area DA. That is, the foldable display device 100 may be folded along an arbitrary folding line FL defined in the display area DA. In FIGS. 1 to 3, even though it is illustrated that the folding line FL is disposed across a center part of the flexible substrate 110, the present disclosure is not limited thereto and a direction or a position of the folding line FL may be set in various ways.

The display unit 120 is disposed in the display area DA. The display area DA refers to an area where an image is displayed through the display unit 120. The display area DA may have a shape suitable for a design of the foldable display device 100. For example, the display area DA may be formed in various forms such as a pentagon, a hexagon, a circle, or an ellipse.

The display unit 120 may include a plurality of sub pixels. Each of the sub pixels may include an organic light emitting diode and a thin film transistor and a capacitor connected to the organic light emitting diode to drive the organic light emitting diode. In FIGS. 1 to 3, a specific shape of the plurality of sub pixels, the organic light emitting diode, the thin film transistor, and the capacitor is omitted.

The bezel area ZA may be disposed to enclose the display area DA. The bezel area ZA is a non-display area where an image is not actually displayed but wiring lines or circuits for applying various signals to the display unit 120 are disposed. As illustrated in FIG. 1, the bezel area ZA may be disposed to enclose four surfaces of a quadrangular display area DA, but is not limited thereto. For example, the bezel area ZA may be in contact with one or more sides of the display area DA.

The bending area BA may extend from one side of the bezel area ZA. The bending area BA is a non-display area in which an image is not actually displayed and an area which is bent toward a rear surface of the flexible display 110 to reduce a size of the non-display area which is visible to the user. Specifically, as illustrated in FIG. 2, the bending area BA may be bent to the rear surface of the flexible substrate 110 to implement a narrow bezel. Therefore, the pad area PA extending from the bending area BA may be disposed on the rear surface of the flexible substrate 110.

The pad area PA is an area where a plurality of pad electrodes is disposed. The pad area PA may extend from one side of the bending area BA. For example, as illustrated in FIGS. 1 to 3, a first pad area PA1 and a second pad area PA2 extending from a first bending area BA1 and a second bending area BA2, respectively, may be defined. The pad area PA is an area for transmitting various signals applied from various modules which are electrically connected to the plurality of pad electrodes, for example, a chip on film (COF), a printed circuit board (PCB), or a flexible printed circuit board (FPCB) to the display unit 120 through the plurality of pad electrodes and the plurality of wiring lines. In FIGS. 1 to 3, it is exemplarily illustrated that a first flexible printed circuit board 131 and a second flexible printed circuit board 132 are disposed on one side of a first pad area PA1 and a second pad area PA2, respectively.

A plurality of wiring lines is disposed on the flexible substrate 110. As described above, the wiring line extends from the display area DA in which the display unit 120 is disposed, to be connected to the pad electrode of the pad area PA. That is, the wiring line may be configured to extend from the display area DA to the bezel area ZA, the bending area BA, and the pad area PA. The wiring line may transmit various electric signals transmitted from the flexible printed circuit board 130 through the pad electrode to a driving circuit such as a thin film transistor of the display unit 120 disposed in the display area DA.

A display unit 120 disposed at a left side of the folding line FL and a display unit 120 disposed at a right side of the folding line FL may receive signals from different flexible printed circuit boards 131 and 132. For example, a signal transmitted from the first flexible printed circuit board 131 may be transmitted to the display unit 120 disposed at the left side of the folding line FL among the display units 120 through the wiring line disposed in the first pad area PA1 and the first bending area BA1. Further, a signal transmitted from the second flexible printed circuit board 132 may be transmitted to the display unit 120 disposed at the right side of the folding line FL among the display units 120 through the wiring line disposed in the second pad area PA2 and the second bending area BA2.

The bending area BA may be configured by a plurality of bending areas BA1 and BA2. Specifically, as illustrated in FIGS. 1 to 3, the bending area may include a first bending area BA1 and a second bending area BA2 extending from one side of the bezel area ZA.

Here, the plurality of bending areas BA may be separated from each other. Specifically, as illustrated in FIGS. 1 to 3, the first bending area BA1 and the second bending area BA2 may be spaced apart from each other with a predetermined interval. Therefore, a sum of a width WB1 of the first bending area BA1 and a width WB2 of the second bending area BA2 may be smaller than a width W of the flexible substrate 110. Here, the width WB1 of the first bending area BA1, the width WB2 of the second bending area BA2, and the width W of the flexible substrate 110 mean horizontal widths in FIG. 1.

The plurality of bending areas BA may be separated from each other in a position corresponding to the folding line FL. That is, the folding line FL is disposed so as not to overlap the plurality of bending areas BA. For example, as illustrated in FIGS. 1 to 3, the first bending area BA1 and the second bending area BA2 do not overlap the folding line FL. Therefore, when the flexible substrate 110 is folded along the folding line FL, the stress concentrated on the bending area BA may be reduced.

Meanwhile, the plurality of bending areas BA may be manufactured by the following processes. For example, in a mother board in which the plurality of display panels is defined, the first bending area and the second bending area are not spaced apart from each other and form one bending area. In this case, during a process of scribing the mother board into a plurality of display panels, a cutting process is performed between the first bending area and the second bending area so that the first bending area and the second bending area may be spaced apart from each other.

Meanwhile, differently from the foldable display device 110 according to an exemplary embodiment of the present disclosure, a case when the bending area BA and the folding line FL overlap will be described below.

In order to implement a narrow bezel, as illustrated in FIG. 2, the bending area BA may be primarily bent toward the rear surface of the flexible substrate 110. Further, as illustrated in FIG. 3, the flexible substrate 110 may be folded along the folding line FL. In this case, when the folding line FL and the bending area BA overlap each other, the bending area BA which is primarily bent is folded again along the folding line FL. Therefore, in the bending area BA, bending and/or folding may occur two times in total. As described above, while the bending area BA is bent and folded two times, a considerably large stress may be concentrated as compared with one time of bending or folding. Therefore, a place on which the stress is concentrated is cracked so that the durability of the flexible substrate is highly likely to be weakened.

In contrast, in the foldable display device 100 according to the exemplary embodiment of the present disclosure, the folding line FL and the bending area BA do not overlap each other so that, as described above, the stress concentrated due to the two times or more of folding and/or bending may be suppressed. Therefore, a foldable display device 100 with a higher durability may be provided.

Specifically, in the foldable display device 100 according to the exemplary embodiment of the present disclosure, when the flexible substrate 110 is folded along the folding line FL, the flexible substrate 110 may be more easily folded. That is, as described above, the first bending area BA1 and the second bending area BA2 are spaced apart from each other and the first bending area BA1 and the second bending area BA2 do not overlap the folding line FL. Therefore, when the flexible substrate 110 is folded along the folding line FL, the first bending area BA1 and the second bending area BA2 are spaced apart from each other so that an area which resists a folding force is reduced. Thus, the flexible substrate 110 is more easily folded and the stress applied to the flexible substrate 110 and various components disposed in the flexible substrate 110 may be reduced.

Further, the foldable display device 100 according to the exemplary embodiment of the present disclosure may provide a flexible substrate 110 with a higher durability. Specifically, in the foldable display device 100 according to the exemplary embodiment of the present disclosure, the plurality of bending areas BA is separated from each other on the folding line FL, so that it is possible to prevent the flexible substrate 110 from being folded and/or bent two times or more. Therefore, the stress concentrated on the flexible substrate 110 due to two times or more of folding and/or bending may be reduced. Accordingly, the flexible substrate 110 with a higher durability may be provided.

Figure 4:
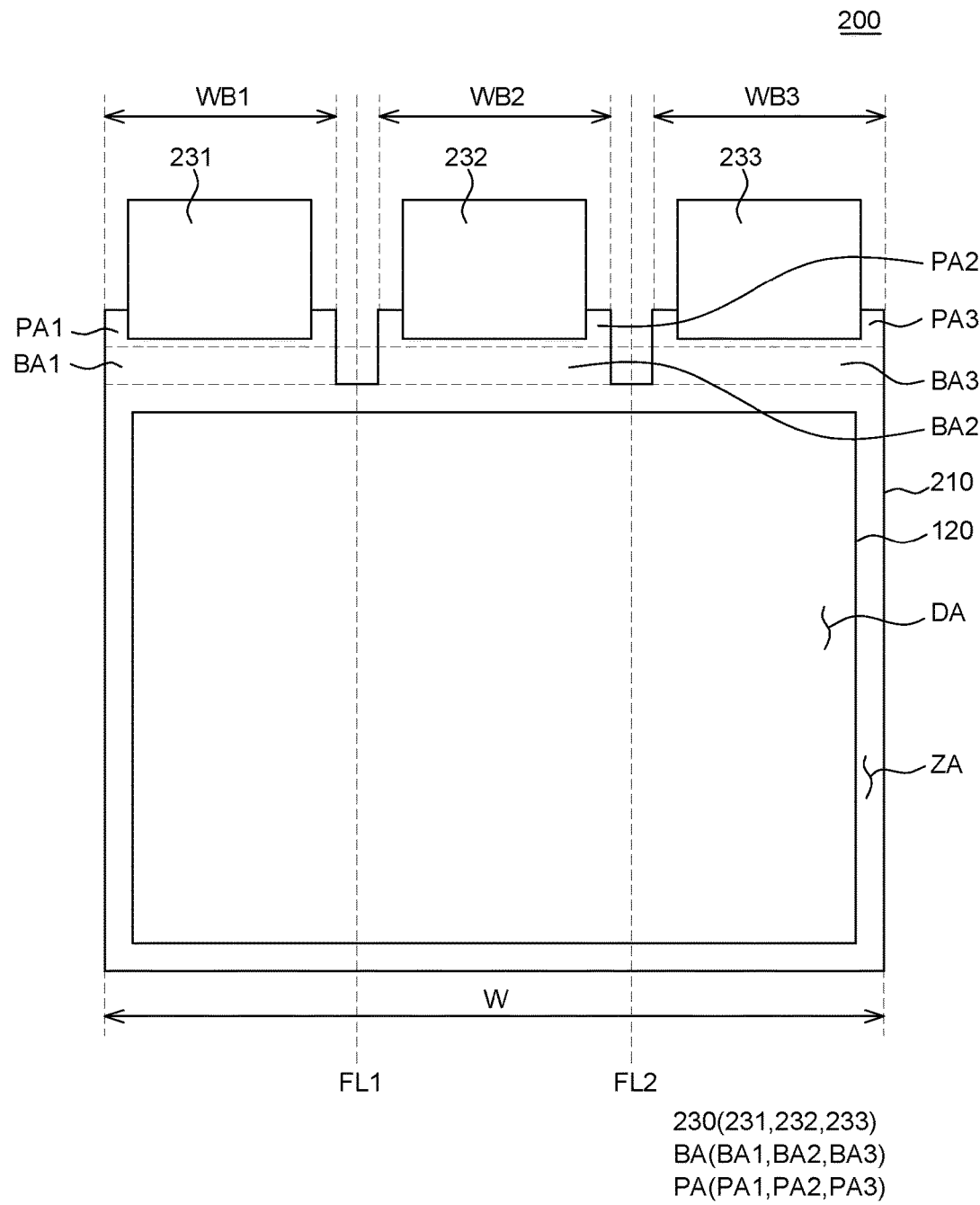
FIG. 4 is a plan view illustrating a foldable display device according to another exemplary embodiment of the present disclosure.

FIG. 4 is a plan view illustrating a foldable display device according to another exemplary embodiment of the present disclosure. As compared with the foldable display device 100 illustrated in FIGS. 1 to 3, in a foldable display device 200 illustrated in FIG. 4, the number of bending areas BA, the pad areas PA, and the flexible printed circuit boards 230 is different, but other components are substantially the same. Therefore, a description thereof will be omitted.

Referring to FIG. 4, the foldable display device 200 includes a flexible substrate 210 including a display area DA, a bezel area ZA, a bending area BA, and a pad area PA and a display unit 120.

As illustrated in FIG. 4, in the flexible substrate 210, a total of two folding lines FL1 and FL2 including a first folding line FL1 and a second folding line FL2 are defined. The flexible substrate 210 may be folded individually along the first folding line FL1 and the second folding line FL2 or folded simultaneously along the first folding line FL1 and the second folding line FL2.

Further, the flexible substrate 210 may include three bending areas BA. Specifically, as illustrated in FIG. 4, a first bending area BA1, a second bending area BA2, and a third bending area BA3 extending from one side of the bezel area ZA are spaced apart from each other with a predetermined interval to be equipped on the flexible substrate 210.

The bending areas BA1, BA2, and BA3 are separated from each other in positions corresponding to the folding lines FL1 and FL2. That is, the folding lines FL1 and FL2 are disposed so as not to overlap the bending areas BA1, BA2, and BA3. Specifically, as illustrated in FIG. 4, the first bending area BA1 and the second bending area BA2 are disposed to be opposite to each other with respect to the first folding line FL1. Further, the second bending area BA2 and the third bending area BA3 are disposed to be opposite to each other with respect to the second folding line FL2. Therefore, even when the flexible substrate 210 is folded along the first folding line FL1 and/or the second folding line FL2, the stress concentrated on each of the bending areas BA1, BA2, and BA3 may be reduced.

Meanwhile, the number of folding lines FL and the number of bending areas BA of the flexible substrate 210 are not limited to those illustrated in FIG. 4. Specifically, the flexible substrate 210 may include three or more folding lines FL and include a plurality of bending areas BA so as not to overlap the folding line FL. Therefore, when the flexible substrate 210 is folded along the folding line FL, the stress concentrated due to the folding and/or bending overlapping in the bending area BA may be reduced.

In the foldable display device 200 according to the exemplary embodiment, even when the flexible substrate is folded along two folding lines FL1 and FL2, the stress concentrated due to the folding and/or bending overlapping in the bending area BA may be reduced. Specifically, as the foldable display device 200 is configured to be folded along two folding lines FL1 and FL2 and the bending area BA is disposed so as not to overlap the folding lines FL1 and FL2, even when the foldable display device 200 is folded along the folding line FL, the stress concentrated in the bending area BA due to the folding and/or bending which overlap two times or more may be reduced.

Figure 5:
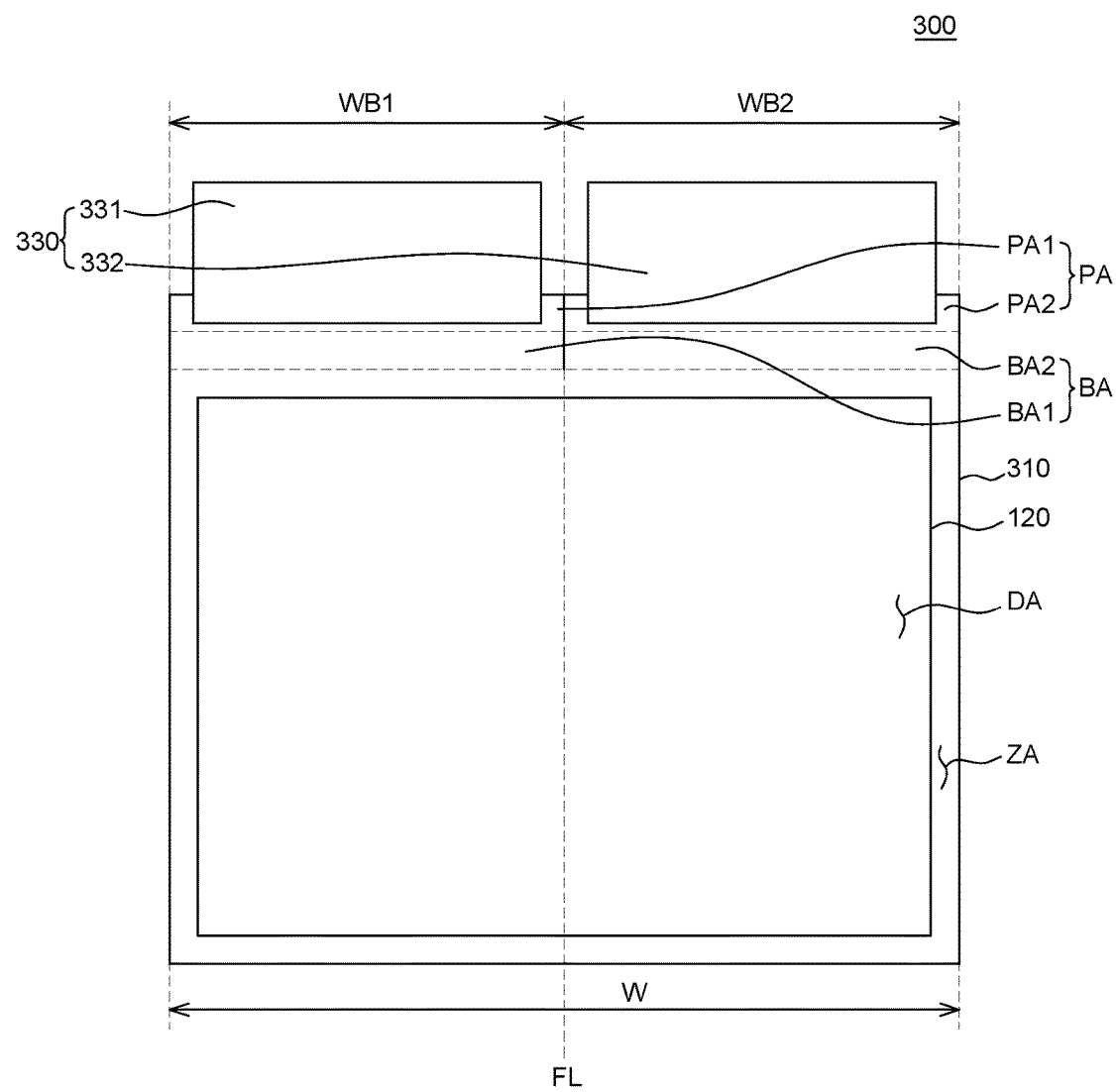
FIG. 5 is a plan view illustrating a foldable display device according to still another exemplary embodiment of the present disclosure.

FIG. 5 is a plan view illustrating a foldable display device according to still another exemplary embodiment of the present disclosure. A foldable display device 300 illustrated in FIG. 5 is different from the foldable display device 100 illustrated in FIGS. 1 to 3 in that the bending area BA is not spaced apart from the folding line FL, but other components are substantially the same. Therefore, a redundant description thereof will be omitted.

Referring to FIG. 5, the foldable display device 300 includes a flexible substrate 310 including a display area DA, a bezel area ZA, a bending area BA, and a pad area PA and a display unit 120.

As illustrated in FIG. 5, a sum of a width WB1 of a first bending area BA1 and a width WB2 of a second bending area BA2 is equal to a width W of the flexible substrate 310. Specifically, the first bending area BA1 and the second bending area BA2 are not spaced apart from each other, but are just separated from each other. That is, when the first bending area BA1 and the second bending area BA2 are bent to the rear surface of the flexible substrate 310, the first bending area BA1 and the second bending area BA2 may be independently bent from each other.

Meanwhile, the plurality of bending areas BA may be manufactured by the following processes. For example, in a mother board in which the plurality of display panels is defined, the first bending area and the second bending area may not be separated from each other and form one bending area. In this case, during a process of scribing the mother board into a plurality of display panels, a cutting process is performed between the first bending area and the second bending area so that the first bending area and the second bending area may be separated from each other.

Moreover, since a sum of the width WB1 of the first bending area BA1 and the width WB2 of the second bending area BA2 is equal to a width W of the flexible substrate 310, the first bending area BA1 and the second bending area BA2 may provide a larger space in which the wiring line may be disposed. That is, the wiring line may be disposed in all areas provided by the flexible substrate 310. For example, as illustrated in FIG. 5, the wiring line may be disposed in all areas of the width WB1 of the first bending area BA1 and the width WB2 of the second bending area BA2. Further, the width WB1 of the first bending area BA1 and the width WB2 of the second bending area BA2 are equal to the width W of the flexible substrate 310, so that the wiring line may be disposed in all areas provided by the flexible substrate 310. Therefore, in the foldable display device 100 according to the exemplary embodiment, a high degree of freedom of design for the wiring line may be provided.

Meanwhile, when the flexible substrate 310 is folded along the folding line FL, the stress generated in the flexible substrate 310 as the folding line FL is folded may be generated along the folding line FL of the flexible substrate 310. However, as described above, the first bending area BA1 and the second bending area BA2 are separated from each other on the folding line FL. Therefore, when the flexible substrate 310 is folded along the folding line FL, the first bending area BA1 and the second bending area BA2 are separated from each other so that the stress due to the two times or more of overlapped folding may not be concentrated on both the first bending area BA1 and the second bending area BA2.

Figure 6:
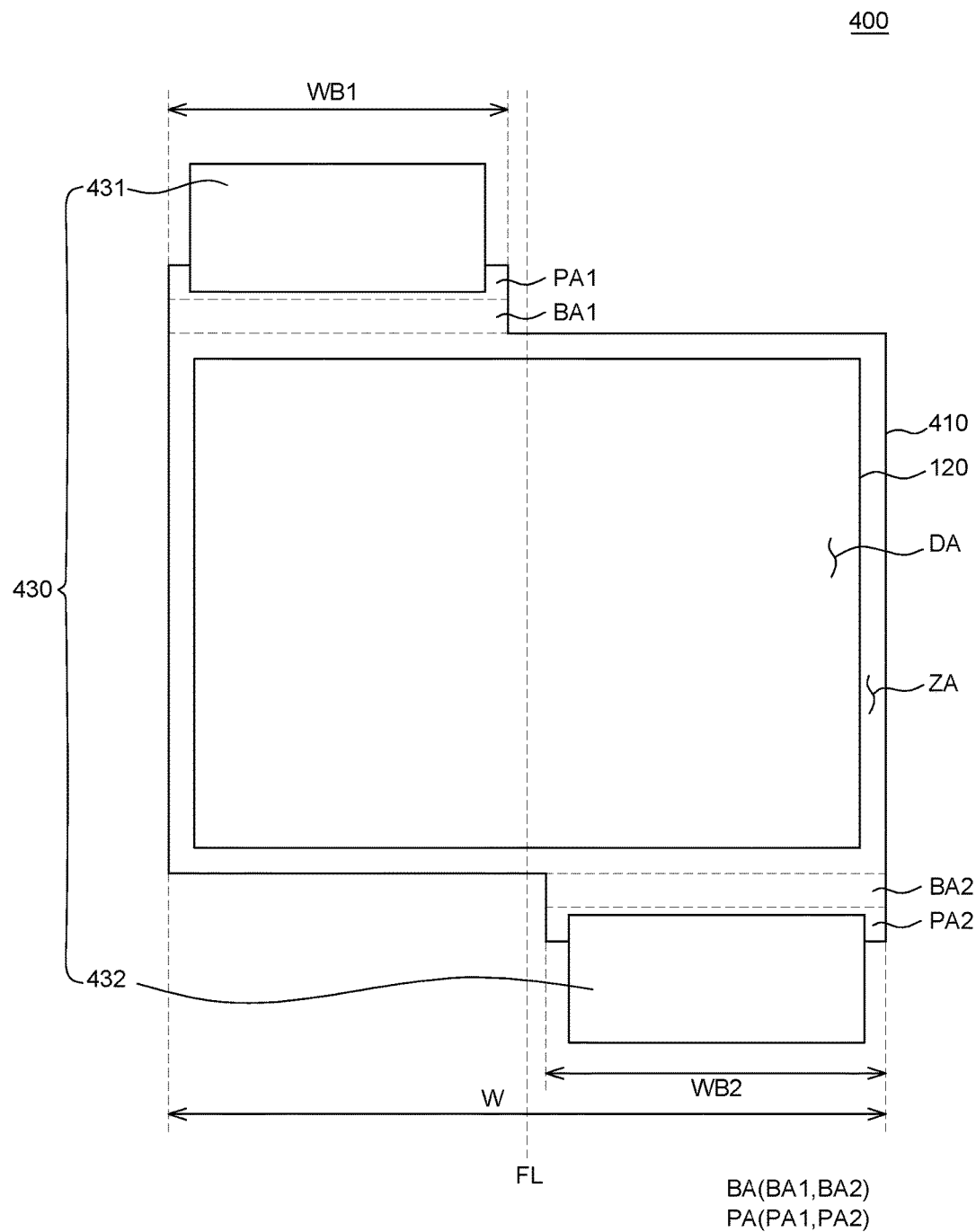
FIG. 6 is a plan view illustrating a foldable display device according to still another exemplary embodiment of the present disclosure.
Figure 7:
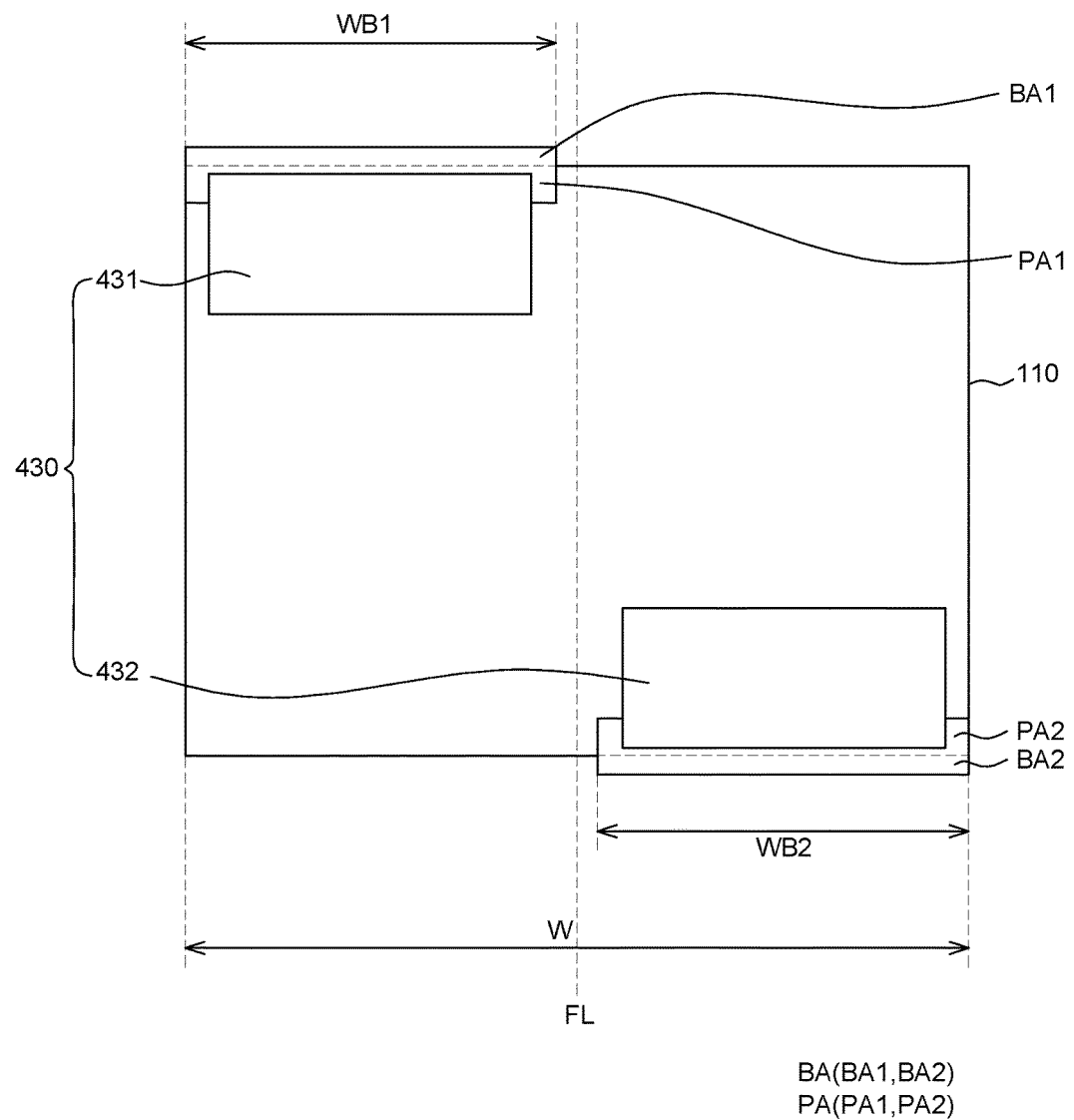
FIG. 7 is a bottom view illustrating a foldable display device in which a bending area of the substrate illustrated in FIG. 6 is bent to a rear surface.
Figure 8:
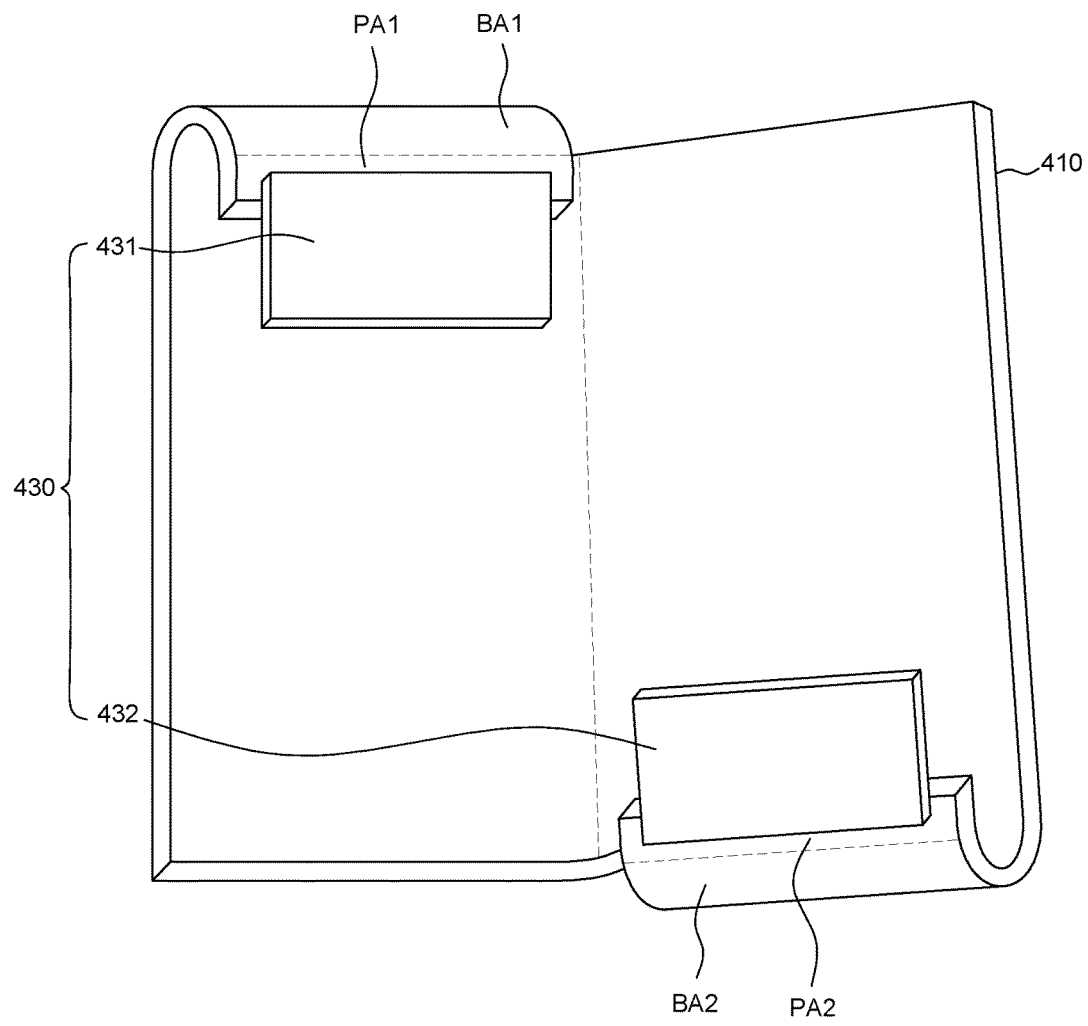
FIG. 8 is a perspective view illustrating a status in which the foldable display device illustrated in FIG. 7 is folded along a folding line.

FIG. 6 is a plan view illustrating a foldable display device according to still another exemplary embodiment of the present disclosure. FIG. 7 is a bottom view illustrating a foldable display device in which a bending area of a substrate illustrated in FIG. 6 is bent to a rear surface of the substrate. FIG. 8 is a perspective view illustrating a status in which the foldable display device illustrated in FIG. 7 is folded along a folding line. A foldable display device 400 illustrated in FIGS. 6 to 8 is different from the foldable display device 100 illustrated in FIGS. 1 to 3 in that the second bending area BA2 is disposed to be opposite to the first bending area BA1 with respect to the flexible substrate, but other components are substantially the same. Therefore, a redundant description thereof will be omitted.

Referring to FIG. 6, the foldable display device 400 includes a flexible substrate 410 including a display area DA, a bezel area ZA, a bending area BA, and a pad area PA and a display unit 120.

As illustrated in FIG. 6, the bending area BA includes a first bending area BA1 extending from one side of the bezel area ZA and a second bending area BA2 extending from the other side of the bezel area ZA which is an opposite side of one side of the bezel area from which the first bending area BA1 extends. That is, the first bending area BA1 and the second bending area BA2 protrude from opposite sides of the bezel area ZA.

Further, the first bending area BA1 is disposed at a left side with respect to the folding line FL and the second bending area BA2 is disposed at a right side with respect to the folding line FL. That is, the first bending area BA1 and the second bending area BA2 are not disposed on the same side with respect to the folding line FL. The reason is to transmit an electric signal to the entire display unit 120 from the flexible printed circuit board 430 disposed in the first pad area PA1 and the second pad area PA2 extending from the first bending area BA1 and the second bending area BA2.

The bending areas BA may be separated from each other in a position corresponding to the folding line FL. Specifically, the first bending area BA1 and the second bending area BA2 are disposed up and down with respect to the bezel area ZA and the first bending area BA1 and the second bending area BA2 do not overlap the folding line FL. That is, the first bending area BA1 and the second bending area BA2 are disposed at the left side and the right side of the folding line FL, respectively, to protrude from the bezel area ZA to have a predetermined distance spaced from the folding line FL. Therefore, a sum of a width WB1 of the first bending area BA1 and a width WB2 of the second bending area BA2 may be smaller than a width of the flexible substrate 410.

Referring to FIG. 7, the bending area BA may be bent to the rear surface of the flexible substrate 410 to implement a narrow bezel. Therefore, the pad area PA extending from the bending area BA may be disposed on the rear surface of the flexible substrate 410.

As described above, a first pad area PA1 in which a first flexible printed circuit board 431 is disposed extends from the first bending area BA1 and a second pad area PA2 in which a second flexible printed circuit board 432 is disposed extends from the second bending area BA2. A left side of the display unit 120 with respect to the folding line FL receives a signal from the first flexible printed circuit board 431 and a right side of the display unit 120 with respect to the folding line FL receives a signal from the second flexible printed circuit board 432.

Here, in each of pixels disposed in the display unit 120, a capacitor corresponding to each of the pixels is disposed. In the capacitor corresponding to each of the pixels, a voltage of sub pixels which are driven in each pixel may be charged.

Specifically, when a scan line which scans a voltage applied to each pixel to transmit a signal to the thin film transistor scans a voltage of the sub pixels which are driven in each pixel, the scan line may scan the voltage which is stored in advance in the capacitor corresponding to each pixel. Further, a thin film transistor corresponding to each pixel may control a driving current amount supplied to an organic light emitting diode of each pixel based on a scanned voltage.

Further, when the scan line scans the voltage stored in the capacitor corresponding to other pixels after scanning a voltage stored in a capacitor corresponding to each pixel, in capacitors of pixels which are already scanned, a voltage which will be scanned by next scanning may be charged. For example, when the scan line scans the voltage stored in a capacitor of an arbitrary first pixel to drive the first pixel and then scans a voltage of a second pixel which is not simultaneously scanned by the first pixel and the scan line, the flexible printed circuit board 430 may store a voltage which will be driven in the first pixel in a capacitor corresponding to the first pixel, in advance.

Therefore, even though the first pad area PA1 and the second pad area PA2 extend from different sides of the bezel area ZA so that directions of data input to the display area are opposite to each other, as described above, a voltage to be scanned is charged in advance in the capacitor corresponding to each pixel. Thus, pixels of the display area DA may be driven regardless of the position in which the flexible printed circuit board 430 is disposed.

Referring to FIG. 8, when the foldable display device is folded along the folding line FL, the first flexible printed circuit board 431 and the second flexible printed circuit board 432 disposed in the first pad area PA1 and the second pad area PA2, respectively, may be configured so as not to overlap each other. That is, when the flexible substrate 410 is folded along the folding line FL across the display area DA, the flexible printed circuit board 430 disposed in the first pad area PA1 may overlap only the flexible substrate 410 corresponding to the second pad area PA2 between the flexible printed circuit board 430 disposed in the second pad area PA2 and the flexible substrate 410 corresponding to the second pad area PA2.

Specifically, as illustrated in FIG. 8, in the first pad PA1 and the second pad PA2 extending from the first bending area BA1 and the second bending area BA2 which are bent to the rear surface of the flexible substrate 410, the first flexible printed circuit board 431 and the second flexible printed circuit board 432 may be disposed.

When the flexible substrate 410 is folded along the folding line FL, the first flexible printed circuit board 431 disposed at a left side with respect to the folding line FL may be disposed to overlap a right side of the rear surface of the flexible substrate 410 with respect to the folding line FL. Further, the second flexible printed circuit board 432 disposed at a right side of the flexible substrate 410 with respect to the folding line FL may be disposed to overlap a left side of the rear surface of the flexible substrate 410 with respect to the folding line FL.

That is, when the flexible substrate 410 is folded along the folding line FL, the first flexible printed circuit board 431 and the second flexible printed circuit board 432 may be disposed so as not to overlap each other. Therefore, in the foldable display device 400 according to an exemplary embodiment of the present disclosure, an interference of a signal which may be generated by disposing the flexible printed circuit boards 430 to overlap each other may be reduced.

Figure 9:
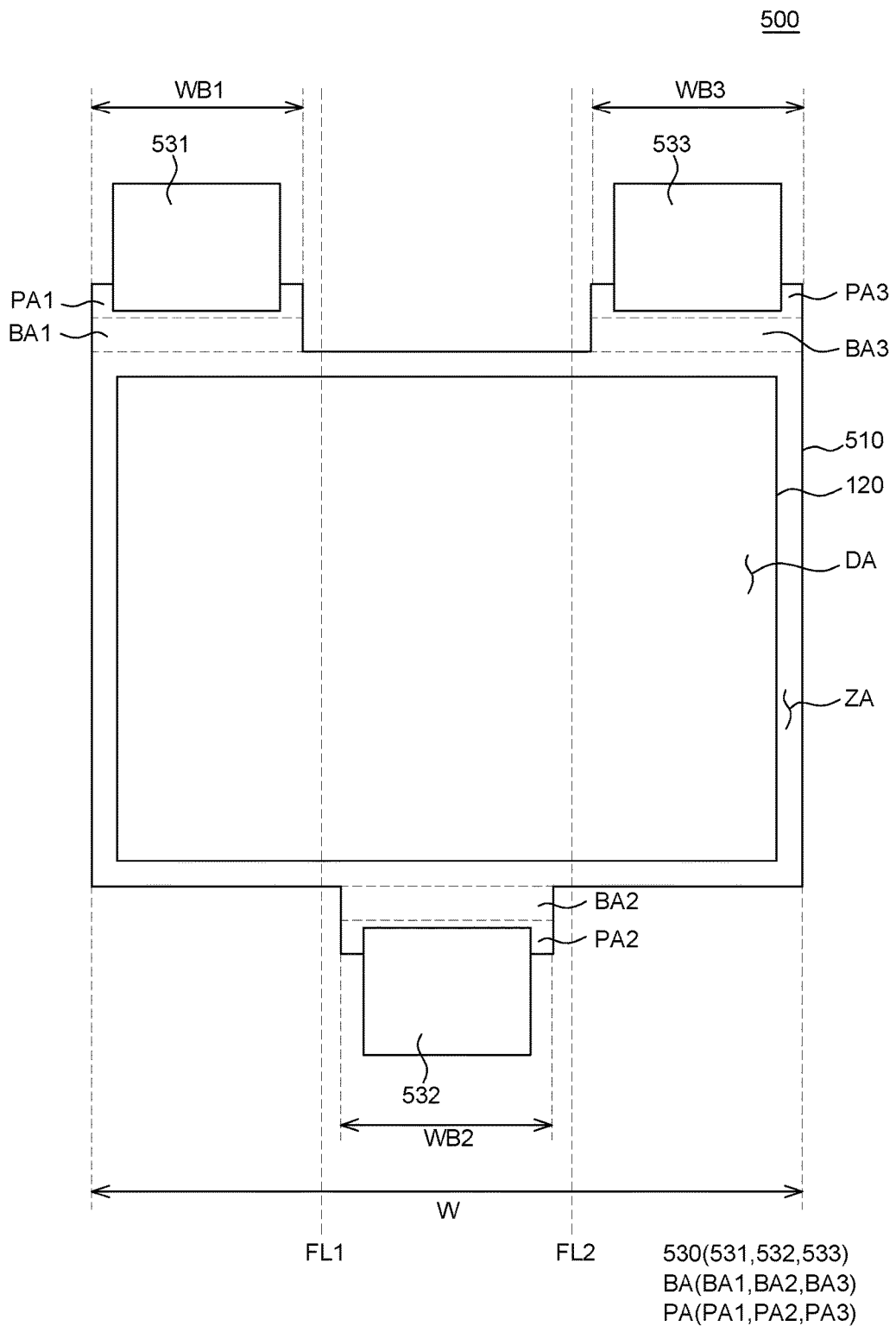
FIG. 9 is a plan view illustrating a foldable display device according to still another exemplary embodiment of the present disclosure.

FIG. 9 is a plan view illustrating a foldable display device according to still another exemplary embodiment of the present disclosure. A foldable display device 500 illustrated in FIG. 9 is different from the foldable display device 200 illustrated in FIG. 4 in that the second bending area BA2 is disposed on a side opposite to a side where the first bending area BA1 and a third bending area BA3 are disposed with respect to a bezel area ZA, but other components are substantially the same. Therefore, a redundant description thereof will be omitted.

Referring to FIG. 9, the foldable display device 500 includes a flexible substrate 510 including a display area DA, a bezel area ZA, a bending area BA, and a pad area PA and a display unit 120.

As illustrated in FIG. 9, in the flexible substrate 510, a total of two folding lines FL1 and FL2 including a first folding line FL1 and a second folding line FL2 are defined. The flexible substrate 510 may be folded individually along the first folding line FL1 and the second folding line FL2 or folded simultaneously along the first folding line FL1 and the second folding line FL2.

Further, the flexible substrate 510 may include three bending areas BA. Specifically, as illustrated in FIG. 9, the flexible substrate 510 may include a first bending area BA1 extending from one side of the bezel area ZA, a second bending area BA2 extending from the other side of the bezel area ZA, and a third bending area BA3 extending from one side of the bezel area ZA again. That is, the first bending area BA1, the second bending area BA2, and the third bending area BA3 are disposed alternately in one side and the other side with respect to the bezel area ZA in a zigzag pattern.

Meanwhile, a sum of a width WB1 of the first bending area BA1, a width WB2 of the second bending area BA2, and a width WB3 of the third bending area BA3 may be smaller than a width W of the flexible substrate 510. Specifically, an end portion of the first bending area BA1 and an end portion of the second bending area BA2 which are adjacent to the first folding line FL1 may be spaced apart from the first folding line FL1 with a predetermined distance. Further, an end portion of the second bending area BA2 and an end portion of the third bending area BA3 which are adjacent to the second folding line FL2 may be spaced apart from the second folding line FL2 with a predetermined distance. Therefore, a sum of the width WB1 of the first bending area BA1, the width WB2 of the second bending area BA2, and the width WB3 of the third bending area BA3 may be smaller than the width W of the flexible substrate 510.

However, differently from that illustrated in FIG. 9, at least one of the first bending area BA1 and the second bending area BA2 may be configured such that at least one end portion of the first bending area BA1 and the second bending area BA2 is in contact with the first folding line FL1. Further, at least one of the second bending area BA2 and the third bending area BA3 may be configured such that at least one end portion of the second bending area BA2 and the third bending area BA3 is in contact with the second folding line FL2. Further, the flexible substrate 510 may be configured such that a sum of a width WB1 of the first bending area BA1, a width WB2 of the second bending area BA2, and a width WB3 of the third bending area BA3 is equal to a width W of the flexible substrate 510.

Accordingly, since a width of at least one of the first bending area BA1, the second bending area BA2, and the third bending area BA3 is increased, an area in which a wiring line is provided by the flexible substrate 510 may be increased.

Further, the bending areas BA1, BA2, and BA3 are separated from each other in positions corresponding to the folding lines FL1 and FL2. That is, the folding lines FL1 and FL2 are disposed so as not to overlap the bending areas BA1, BA2, and BA3. Specifically, as illustrated in FIG. 9, the first bending area BA1 and the second bending area BA2 are disposed in a left side and a right side with respect to the first folding line FL1, respectively. Further, the second bending area BA2 and the third bending area BA3 are disposed in a left side and a right side with respect to the second folding line FL2, respectively. Therefore, even when the flexible substrate 510 is folded along the first folding line FL1 and/or the second folding line FL2, the stress concentrated on each of the bending areas BA1, BA2, and BA3 may be reduced.

Meanwhile, the bending area BA illustrated in FIG. 9 may be described as follows. Two bending areas BA1 and BA3 extending to one side of the bezel area ZA are a plurality of first bending areas and one bending area BA2 extending to the other side which is opposite to one side of the bezel area ZA may be a second bending area. Further, two bending areas BA1 and BA3 extending to one side of the bezel area ZA are a plurality of second bending areas and one bending area BA2 extending to the other side which is opposite to one side of the bezel area ZA may be a first bending area.

Further, differently from that illustrated in FIG. 9, the bending area BA may be disposed as described below. The bending area BA may further include a third bending area BA3 extending from one of one side of the bezel area ZA and the other side of the bezel area ZA other than the first bending area BA1 and the second bending area BA2. The third bending area BA3 may be disposed so as to correspond to one of the first bending area BA1 and the second bending area BA2. For example, the first bending area BA1 and the third bending area BA3 are disposed in parallel in one side of the bezel area ZA and the second bending area BA2 may be disposed in the other side of the bezel area ZA. As another example, the first bending area BA1 is disposed in one side of the bezel area ZA and the third bending area BA3 and the second bending area BA2 may be disposed in parallel in the other side of the bezel area ZA.

In the foldable display device 500 according to the exemplary embodiment, when the flexible substrate 510 is folded by a plurality of folding lines FL, the stress concentrated in the bending area BA may be reduced. As described above, since the folding line FL and the bending area BA do not overlap each other, even when the flexible substrate 510 is folded along the plurality of folding lines FL, two times or more of bending and/or folding do not overlap in the bending area BA bent to the rear surface of the flexible substrate 510. Therefore, the stress concentrated in the bending area BA due to the bending and/or folding may be reduced.

Further, in the foldable display device 500 according to the exemplary embodiment, even when the flexible substrate 510 is folded by the plurality of folding lines FL, the signal interference generated by the overlapping flexible printed circuit boards 530 may be minimized.

Specifically, each bending area BA of the foldable display device 500 according to the exemplary embodiment may be bent to the rear surface of the flexible substrate 510 similarly to the above-described exemplary embodiments. Therefore, the flexible printed circuit board 530 disposed in each pad area PA extending from each bending area BA is also disposed on the rear surface of the flexible substrate 510.

Here, even though the flexible substrate 510 is folded along the first folding line FL1 and/or the second folding line FL2, the flexible printed circuit boards 531, 532, and 533 disposed on the rear surface of the flexible substrate 510 are configured so as not to overlap each other. Therefore, even when the foldable display device 530 according to the exemplary embodiment is folded by a plurality of folding lines FL, the signal inference generated by the overlapping flexible printed circuit boards 531, 532, and 533 may be minimized.

Figure 10:
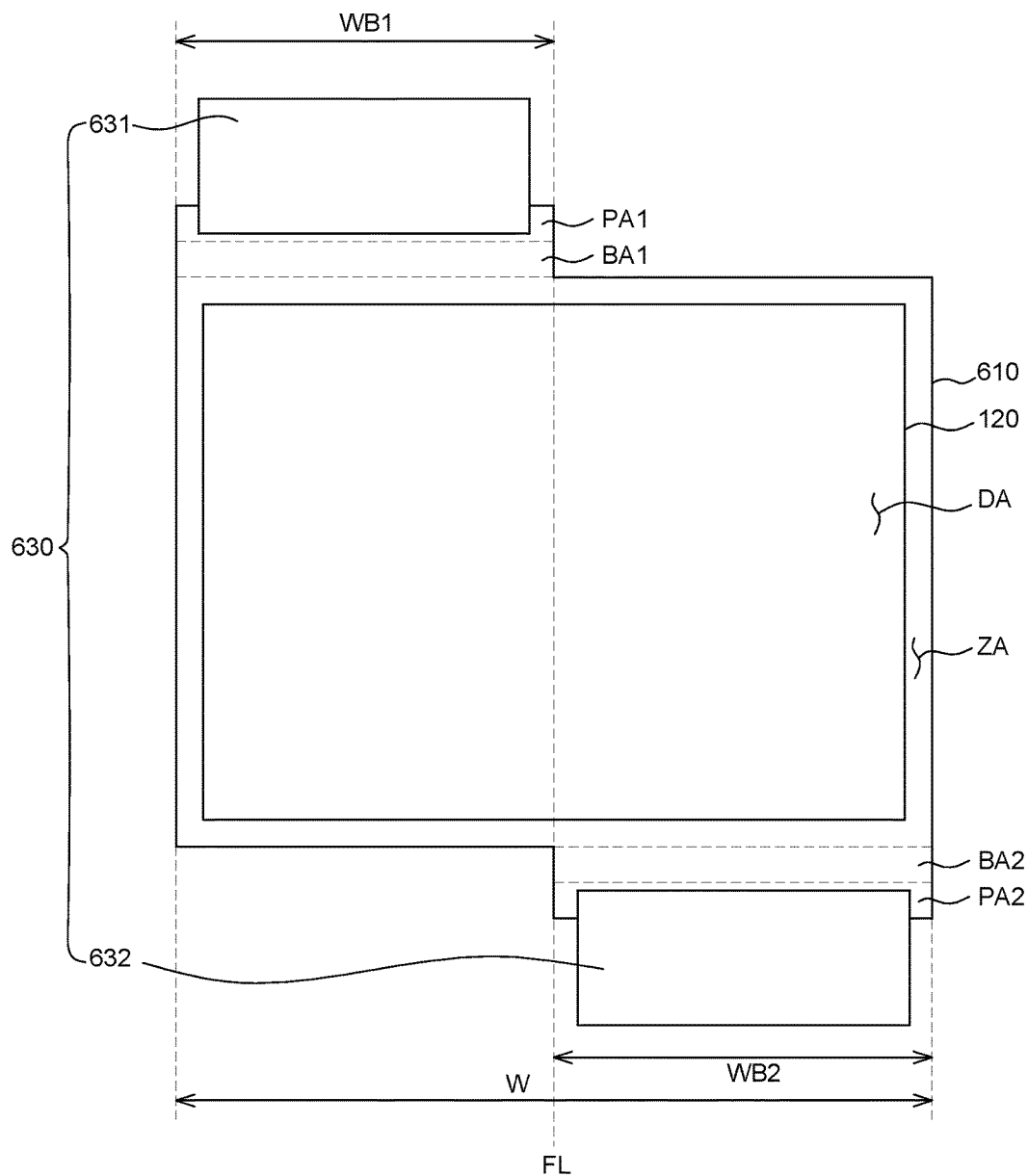
FIG. 10 is a plan view illustrating a foldable display device according to still another exemplary embodiment of the present disclosure.

FIG. 10 is a plan view illustrating a foldable display device according to still another exemplary embodiment of the present disclosure. A foldable display device 600 illustrated in FIG. 10 is different from the foldable display device 300 illustrated in FIG. 5 in that the second bending area BA2 is disposed on a side opposite to a side where the first bending area BA1 is disposed with respect to a bezel area ZA, but other components are substantially the same. Therefore, a redundant description thereof will be omitted.

Referring to FIG. 10, the foldable display device 300 includes a flexible substrate 610 including a display area DA, a bezel area ZA, a bending area BA, and a pad area PA and a display unit 120.

As illustrated in FIG. 10, the first bending area BA1 extends from one side of the bezel area ZA and the second bending area BA2 extends from the other side opposite to one side of the bezel area ZA. That is, the first bending area BA1 and the second bending area BA2 extend in opposite directions with respect to the bezel area ZA.

Therefore, the first pad area PA1 and the second pad area PA2 extending from the first bending area BA1 and the second bending area BA2, respectively, are disposed in opposite directions. Further, similarly to the above-described exemplary embodiments, the first bending area BA1 and the second bending area BA2 may be bent to the rear surface of the flexible substrate 610. Accordingly, the first pad area PA1 and the second pad area PA2 extending from the first bending area BA1 and the second bending area BA2 and the first flexible printed circuit board 631 and the second flexible printed circuit board 632 disposed in the first pad area PA1 and the second pad area PA2 are also disposed on the rear surface of the flexible substrate 610 in opposite directions.

Further, when the flexible substrate 610 is folded along the folding line FL, the first pad area PA1 and the second pad area PA2 and the first flexible printed circuit board 631 and the second flexible printed circuit board 632 disposed in the first pad area PA1 and the second pad area PA2, respectively, may be configured so as not to overlap each other. Therefore, in the foldable display device 600 according to one exemplary embodiment of the present disclosure, even though the flexible substrate 610 is folded along the folding line FL, the signal interference generated due to the overlapping flexible printed circuit boards 630 may be minimized.

Meanwhile, as illustrated in FIG. 10, a sum of a width WB1 of the first bending area BA1 and a width WB2 of the second bending area BA2 is equal to a width W of the flexible substrate 610. Specifically, one end portions of the first bending area BA1 and the second bending area BA2 are formed to be in contact with the folding line FL. That is, the first bending area BA1 and the second bending area BA2 may not have an area overlapping the folding line FL.

Therefore, in the foldable display device 600 according to the exemplary embodiment of the present disclosure, when the flexible substrate 610 is folded along the folding line FL, the stress generated by the folding of the flexible substrate 610 is not concentrated on the first bending area BA1 and the second bending area BA2 which protrude in opposite directions with respect to the bezel area ZA.

The foldable display device according to exemplary embodiments of the present disclosure can also be described as follows:

A foldable display device according to an exemplary embodiment of the present disclosure includes: a flexible substrate which includes a display area, a bezel area enclosing the display area, and a plurality of bending areas extending from one side of the bezel area, and a display unit disposed in the display area in which the plurality of bending areas is separated from each other.

According to another aspect of the present disclosure, the flexible substrate may be configured to be foldable along at least one folding line across the display area.

According to still another aspect, the plurality of bending areas may be separated from each other in a position corresponding to the folding line.

According to another aspect of the present disclosure, the plurality of bending areas may be disposed to be spaced apart from each other.

According to another aspect of the present disclosure, the flexible substrate may further include a plurality of pad areas extending from each of the plurality of bending areas and a flexible printed circuit board may be disposed in each of the plurality of pad areas.

A foldable display device according to an exemplary embodiment of the present disclosure includes a flexible substrate which includes a display area, a bezel area enclosing the display area, and a plurality of bending areas extending from the bezel area, and a display unit disposed in the display area in which the bending area includes a first bending area extending from one side of the bezel area and a second bending area extending from the other side which is opposite to the one side.

According to another aspect of the present disclosure, a sum of a width of the first bending area and a width of the second bending area may be equal to a width of the flexible substrate.

According to another aspect of the present disclosure, a sum of a width of the first bending area and a width of the second bending area may be smaller than a width of the flexible substrate.

According to another aspect of the present disclosure, the bending area may further include a third bending area extending from one of one side of the bezel area and the other side of the bezel area, and the third bending area may be disposed to correspond to one of the first bending area and the second bending area.

According to another aspect of the present disclosure, at least one of the first bending area and the second bending area may be plural, and the first bending area and the second bending area may be disposed to form a zigzag pattern.

According to another aspect of the present disclosure, the flexible substrate may include a first pad area extending from the first bending area and a second pad area extending from the second bending area and a flexible printed circuit board may be disposed in each of the first pad area and the second pad area.

According to another aspect of the present disclosure, when the flexible substrate is folded along a folding line across the display area, the flexible printed circuit board disposed in the first pad area may overlap only the flexible substrate corresponding to the second pad area between the flexible printed circuit board disposed in the second pad area and the flexible substrate corresponding to the second pad area.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical spirit of the present disclosure. The scope of the technical spirit of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A foldable display device, comprising:
    a flexible substrate which includes a display area, a bezel area enclosing the display area, and a plurality of bending areas extending from one side of the bezel area; and
    a display unit disposed in the display area,
    wherein the flexible substrate is configured to be foldable along at least one folding line across the display area, and
    wherein the plurality of bending areas is separated from each other.

2. The foldable display device according to claim 1, wherein the plurality of bending areas is separated from each other in a position corresponding to the folding line.

3. The foldable display device according to claim 1, wherein the plurality of bending areas is disposed to be spaced apart from each other.

4. The foldable display device according to claim 1, wherein the flexible substrate further includes a plurality of pad areas extending from each of the plurality of bending areas, and
    wherein a flexible printed circuit board is disposed in each of the plurality of pad areas.

5. A foldable display device, comprising:
    a flexible substrate which includes a display area, a bezel area enclosing the display area, and a plurality of bending areas extending from the bezel area; and
    a display unit disposed in the display area,
    wherein a bending area includes a first bending area extending from one side of the bezel area and a second bending area extending from another side which is opposite to the one side, and
    wherein the flexible substrate is configure to be foldable along at least one folding line across the display area.

6. The foldable display device according to claim 5, wherein a sum of a width of the first bending area and a width of the second bending area is equal to a width of the flexible substrate.

7. The foldable display device according to claim 5, wherein a sum of a width of the first bending area and a width of the second bending area is smaller than a width of the flexible substrate.

8. The foldable display device according to claim 5, wherein the bending area further includes a third bending area extending from the one side of the bezel area or the another side of the bezel area.

9. The foldable display device according to claim 5, wherein at least one of the first bending area and the second bending area is plural, and
    wherein the first bending area and the second bending area are disposed to form a zigzag pattern.

10. The foldable display device according to claim 5, wherein the flexible substrate includes a first pad area extending from the first bending area and a second pad area extending from the second bending area, and
    wherein a flexible printed circuit board is disposed in each of the first pad area and the second pad area.

11. The foldable display device according to claim 10, wherein when the flexible substrate is folded along the at least one folding line across the display area, a first flexible printed circuit board disposed in the first pad area overlaps only a second flexible substrate corresponding to the second pad area between a second flexible printed circuit board disposed in the second pad area and the second flexible substrate corresponding to the second pad area.

* * * * *